Sept. 21, 1965 B. KRIEGSMAN 3,206,827

METHOD OF PRODUCING A SEMICONDUCTOR DEVICE

Filed July 6, 1962

INVENTOR.
BERNARD KRIEGSMAN

BY James and Franklin
ATTORNEYS

United States Patent Office 3,206,827

Patented Sept. 21, 1965

3,206,827
METHOD OF PRODUCING A SEMICONDUCTOR DEVICE

Bernard Kriegsman, Brooklyn, N.Y., assignor to General Instrument Corporation, Newark, N.J., a corporation of New Jersey Filed July 6, 1962, Ser. No. 208,019
4 Claims. (Cl. 29—25.3)

The present invention relates to a semiconductor device such as a transistor over an active surface of which an aluminum sealing layer is applied, and to the method of forming such a device.

Many types of semiconductor devices, and particularly transistors, are provided on one of their active surfaces with an oxide layer, usually provided with an opening to the active surface of the semiconductor body. The apertured oxide layer (usually silicon dioxide when the semiconductor body is itself formed of silicon) is utilized as a mask controlling the diffusion of impurities into the semiconductor bodies in order to impart desired semiconductive characteristics thereto. Once in place these layers function to protect the active surface of the semiconductor body from the deleterious effect of moisture or other impurities, but only to a limited extent. Moreover, impurities tend to escape from the oxide layer, particularly when the device is subjected to high temperatures on the order of 300° C., and these impurities often migrate to, and adversely affect, the exposed terminal areas of the device. This has caused many malfunctions and losses in desired operating characteristics of semiconductor devices. In addition, in the case of transistors, the oxide layer above the emitter area of the transistor appears to exhibit a very strong tendency to absorb moisture, and if too much moisture is absorbed a short circuit is created between the emitter area of the transistor and the area adjacent thereto, thus causing the transistor to operate imperfectly and sometimes to fail completely.

In the past various types of coatings have been proposed to cover the oxide layer, those coatings serving the function of insulating the oxide layer from atmosphere-carried moisture or impurities and preventing moisture or impurities from escaping from certain portions of the oxide layer and migrating to more vulnerable portions of the device. However, the coatings proposed in the prior art for this purpose have not been satisfactory, principally because they do not stand up well when the device is subjected to elevated temperatures, and because, when the device is subjected to varying temperatures, the bond between such protective layers and the oxide layer therebelow fails by reason of the differences in the temperature coefficients of expansion of the coating layer and the oxide layer respectively. In addition, the application of these prior art layers to the semiconductor device has involved manipulative steps additional to those required to otherwise form a semiconductor unit, thereby adding appreciably to the cost of manufacture of such units.

In accordance with the present invention, the above disadvantages are avoided through the use of a protective layer formed wholly or in substantial part of aluminum. The use of aluminum for this purpose produces an exceptionally effective sealing and protective effect, the protective layer is substantially insensitive to high temperatures, and the bond between the protective layer and the oxide layer therebelow remains firm and unbroken even if the unit is subjected to very radical, rapid and continued temperature changes. Moreover, the formation of this aluminum protective layer is carried out simultaneously with, and by means of, the same manipulative steps as are used to produce terminal bodies on the unit which electrically connect to those portions of the semiconductor body exposed through openings in the oxide layer. As a result the application of the aluminum protective layer to the oxide-coated semiconductor body is accomplished without any significant increase in the cost of manufacture of the unit.

To the accomplishment of the above, and to such other objects as may hereinafter appear, the present invention relates to the structure of a semiconductor device provided with a sealing layer, and to the method of forming such a device, as defined in the appended claims, and as described in this specification, taken together with the accompanying drawings, in which:

Figure 1:
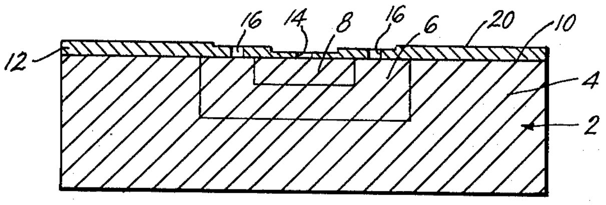
FIG. 1 is a cross sectional view of a transistor provided with an oxide coating, that coating having openings therethrough to appropriate areas of the semiconductor body.

The invention is here specifically disclosed in connection with the formation of a transistor comprising a body 2 of semiconductor material such as silicon divided into a collector portion 4, a base portion 6, and an emitter portion 8, those portions being suitably doped, generally by a double diffusion process, so as to have semiconductor characteristics appropriate to their respective functions, all as is well known in the art. The upper surface 10 of the body 2 is provided with an oxide layer 12, and the oxide layer 12 is provided with an opening 14 communicating with the emitter 8 and with a U-shaped opening 16 communicating with the base area 6, as is also conventional. The oxide layer is usually of silicon dioxide when the body 2 is formed of silicon, but it could be otherwise formed, as by using a layer 12 of silicon monoxide for both silicon and germanium bodies 2, deposited as taught in application Serial Number 169,033 of January 26, 1962, now abandoned, filed by myself and another, entitled, "Masking With Condensed Silicon Monoxide Layer," and assigned to the assignee of this application. Oxide layers of these types may be used for the masking of semiconductor bodies against diffusion impregnation of impurities except at predetermined areas.

To complete the transistor unit, terminal bodies should be formed or inserted in the openings 14 and 16 so as to facilitate electrical connection to the base and emitter areas 6 and 8 respectively, and it is desirable that the oxide layer 12 be substantially covered by a protective layer, for the reasons set forth in the introductory portion of this specification.

Figure 2:
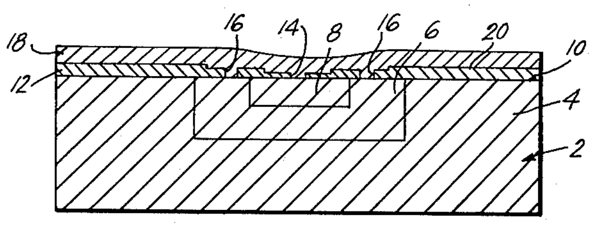
FIG. 2 is a view similar to FIG. 1, but showing an aluminum layer deposited thereon.

In accordance with the present invention a protective layer 18, formed primarily, and preferably substantially exclusively, of aluminum, is deposited over the upper surface 20 of the oxide layer 12, the aluminum layer 18 filling the openings 14 and 16. The forming of the layer 18 in situ is preferably carried out by a conventional metallic evaporation and depositon technique, the thus-deposited aluminum layer 18 being firmly bonded to the upper surface 20 of the oxide layer 12, as well as to the exposed upper surfaces of the base and emitter areas 6 and 8. A transistor unit with such an aluminum layer 18 deposited thereon is illustrated in FIG. 2.

Figure 3:
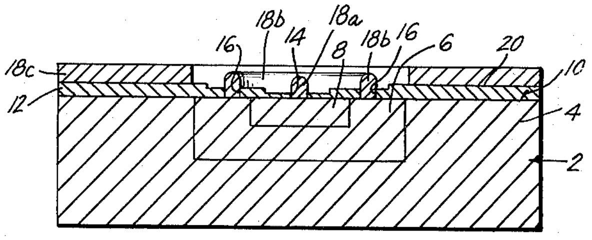
FIG. 3 is a view similar to FIG. 2, but showing the finished unit, with portions of the aluminum layer removed to produce separated aluminum terminal bodies.
Figure 4:
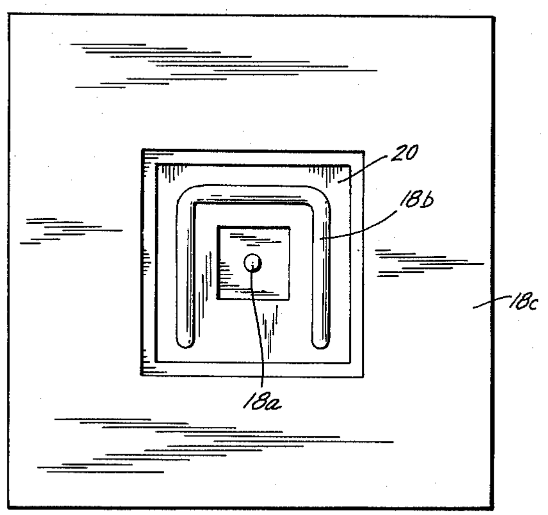
FIG. 4 is a top plan view of the completed unit of FIG. 2.

Next, portions of the aluminum layer 18 are removed from around the openings 14 and 16, the main body of the aluminum layer 18 remaining in place (see FIGS. 3 and 4). This may readily and accurately be done by conventional photo-lithographing and etching techniques well known in the art. As here specifically disclosed, the aluminum is removed from an area substantially corresponding to the periphery of the base area 6, while leaving aluminum in and extending upwardly from the openings 14 and 16 respectively. The aluminum in the opening 14 thus constitutes a terminal body **18*a* which is bonded and electrically connected to the emitter area 8, and the aluminum in and projecting from the U-shaped opening 16 constitutes a terminal body 18*b* bonded and electrically connected to the base area 6, the two terminal bodies 18*a* and 18*b* being physically and electrically insulated from one another and from the remainder 18*c* of the aluminum layer 18, the aluminum portion 18*c* covering and sealing the major portion of the oxide layer 12. Leads to external circuitry can readily be soldered or otherwise attached to the exposed parts of the terminal bodies 18*a* and 18*b***.

The portion **18*c* of the aluminum layer 18 has a temperature coefficient of expansion sufficiently close to that of the oxide layer 12 so that it will remain reliably and firmly bonded thereto despite wide and rapid cyclical excursions of temperature to which the unit may be subjected. It functions as an effective seal and protection for that portion of the oxide layer 12 which it covers, and this sealing and protective function exists at high as well as low temperatures. Moreover, as will be apparent from the above description, the protective layer portion 18*c* is formed and applied simultaneously with the formation and application of the otherwise desired terminal bodies 18*a* and 18*b***, thus minimizing the expense of fabrication of the complete unit, since no separate protective layer application step is required.

While the present invention has been here specifically disclosed only in connection with a particular design and composition of transistor, it will be apparent that the present invention is not limited thereto, and that it has applicability to transistors of other designs and compositions, as well as to oxide-coated semiconductor bodies in general. Accordingly, many variations may be made in the specific design or construction of the units in question, and in the methods used for making them, all without departing from the spirit of the invention as defined in the following claims.

I claim:

1. The method of making a semiconductor device which comprises forming an oxide layer on a surface of a semiconductor body and forming at least one opening therethrough to a predetermined area of said surface, forming a layer comprising aluminum substantially completely over said oxide layer and in said opening, and removing aluminum from around said opening, leaving a separated aluminum terminal portion in and substantially filling said opening and leaving said oxide layer substantially completely covered by said aluminum.

2. The method of making a semiconductor device which comprises forming an oxide layer on a surface of a semiconductor body and forming openings therethrough to predetermined areas of said surface having different semiconductive characteristics, forming a layer comprising aluminum substantially completely over said oxide layer and in said openings, and removing aluminum from around said openings, leaving separated aluminum terminal portions in and substantially filling said openings and leaving said oxide layer substantially completely covered by said aluminum.

3. The method of making a transistor device which comprises forming an oxide layer on a surface of a semiconductor body having emitter, base and collector portions, at least two of said portions being exposed at said surface, said layer having openings leading to said two portions, forming a layer comprising aluminum substantially completely over said oxide layer and in said openings, and removing aluminum from around said openings, leaving separated aluminum terminal portions in and substantially filling said openings and leaving said oxide layer substantially completely covered by said aluminum.

4. The method of making a transistor device which comprises forming an oxide layer on a surface of a semiconductor body having emitter, base and collector portions, at least two of said portions being exposed at said surface at a central area thereof, said layer having openings at said central area leading to said two portions, forming a layer comprising aluminum substantially completely over said oxide layer and in said openings, and removing aluminum from said central area only, except for at least parts of the aluminum in said openings, leaving separated aluminum terminal portions in and substantially filling said openings and leaving said oxide layer outside said central area substantially completely covered by said aluminum.

References Cited by the Examiner

UNITED STATES PATENTS

| | | | |
|---|---|---|---|
| 2,680,220 | 6/54 | Starr | 317—235 |
| 2,858,489 | 10/58 | Henkels | 317—235 |
| 2,981,877 | 4/61 | Noyce | 317—235 |
| 3,025,589 | 3/62 | Hoerni | 317—235 |
| 3,097,308 | 7/63 | Wallmark | 317—235 |

RICHARD H. EANES, Jr., *Primary Examiner.*

JAMES D. KALLAM, *Examiner.*